United States Patent [19]
Henle et al.

[11] 4,016,431
[45] Apr. 5, 1977

[54] OPTIMAL DRIVER FOR LSI

[75] Inventors: Robert Athanasius Henle, Clinton Corners; Irving Tze Ho, Poughkeepsie, both of N.Y.

[73] Assignee: International Business Machines Corporation, Armonk, N.Y.

[22] Filed: Dec. 31, 1975

[21] Appl. No.: 645,765

[52] U.S. Cl. .............................. 307/208; 307/205; 307/270; 307/DIG. 1; 330/35
[51] Int. Cl.² ................ H03K 3/353; H03K 5/159; H03K 19/08
[58] Field of Search .......... 307/205, 208, 213, 214, 307/270, DIG. 1, 293; 330/35

[56] References Cited
UNITED STATES PATENTS 3,378,783  4/1968  Gibson .............................. 330/35

OTHER PUBLICATIONS

Lin et al., "An Optimized Output Stage for MOS Integrated Circuits"; *IEEE Journal of Solid–State Circuits;* vol. SC–10, No. 2, pp. 106–109; Apr. 1975.

*Primary Examiner*—John S. Heyman
*Assistant Examiner*—Larry N. Anagnos
*Attorney, Agent, or Firm*—James M. Thomson

[57] ABSTRACT

An intermediate driver circuit comprising at least five stages which are cascaded between a signal driver, such as a logic circuit on an LSI chip, and a high capacity load driver, such as a driver for long off chip interconnection lines, wherein the total delay in the signal source caused by great disparity between the capacitance of the signal driver and the load driver is minimized. The delay is minimized by use of a cascaded series of n-intermediate drivers where $n = \ln M$, $$n = \ln M, \quad M = \frac{C \text{ (load driver)}}{C \text{ (signal driver)}},$$

and where the capacitance of any intermediate stage is $C_P = \sqrt{C_{(P-1)} \cdot C_{(P+1)}}$. Use of these parameters in the design of intermediate stages, each having a capacitance designed in accordance with the foregoing equations has been found to be useful in connection with amplifiers having five or more intermediate stages, and wherein the ratio of capacitance of the load circuit to the capacitance of the driver circuit is greater than about one hundred to one. The utility of these design parameters in instances where the ratio of capacitance is greater than a thousand to one, and the number of intermediate stages is ten or greater is particularly apparent.

2 Claims, 1 Drawing Figure

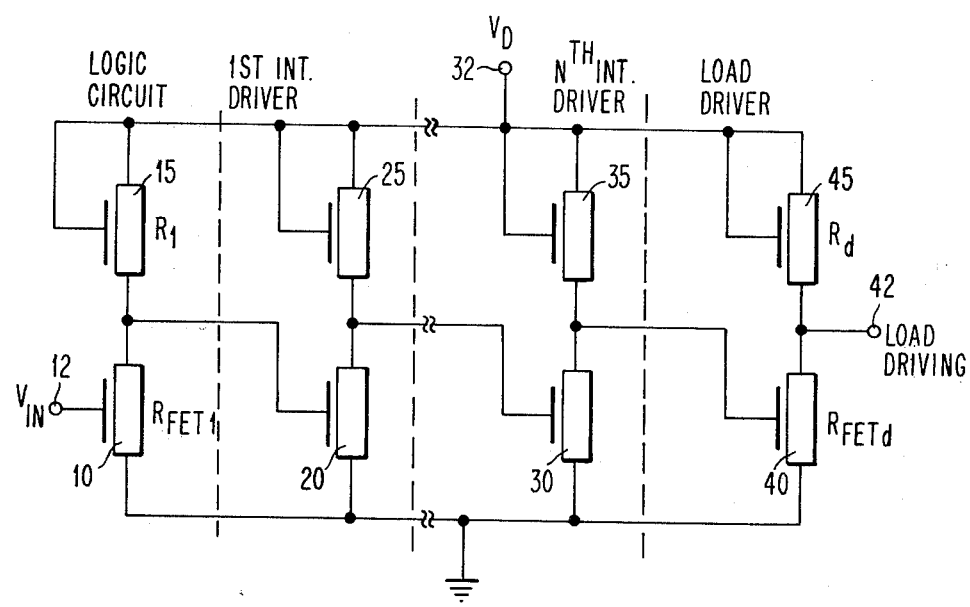

OPTIMAL DRIVER FOR LSI

BACKGROUND OF THE INVENTION

1. Field of the Invention

The present invention is concerned with a multi-stage driving circuit for a high capacitive load utilizing five or more intermediate driver circuits cascaded between a signal driver and a load driver. More particularly, the invention is concerned with such a multi-stage driving circuit wherein the total delay of the signal source caused by great disparity between the capacitance of the signal driver circuit and the load driver circuit is minimized.

2. Description of the Prior Art

Most large scale integration circuit chips, whether logic or memory oriented, requires some driving capability, such as for handling long interconnection lines or enabling information display from the chip. The driving circuits for such purposes usually have a specified current handling capacity which is substantially larger than the current handling capacity for similar circuitry in the large scale integration circuits which handle logic functions or storage functions. Accordingly, the off-chip driving circuits comprise devices which are substantially larger in size than the logic function and storage function devices.

However, in design of the chip layout it should be apparent that the logic function and storage function devices are utilized to drive the larger off chip driving circuits. Accordingly, if the disparity between device sizes and current handling capabilities of the devices is very large, excessive delay occurs between the signal driver circuit and the off-chip or load driver circuit. This typically occurs where off-chip driver circuits are utilized to drive high capacitive loads wherein the output capacitance of the off-chip driver circuit is at least one hundred times greater in magnitude than the output capacitance of the on-chip signal driver circuit utilized to drive the former.

The foregoing problem has been widely recognized and some efforts have been made in the past to optimize circuit design to provide minimum propagation delay in the output stages of integrated or large scale integrated circuits. For example, an article titled "An Optimized Output Stage for MOS Integrated Circuits", IEEE Journal of Solid State Circuits, Volume SC10, No. 2, April, 1975 by Lin and Linholm described an output device for optimizing propogation delay and minimizing chip area. According to Lin and Linholm propogation delay may be minimized by means of tapering the size of the output stages of an MOS integrated amplifier whereby a compromise is attained between decreasing propagation delay and increasing the chip area utilized by the cascaded MOS stages.

In addition, other designers have recognized that the delay between a large current capacity, high capacitance output stage and a low current capacity, low capacitance input stage can be minimized by cascading two or more intermediate driver circuits between the stages, each having a capacitance and size falling somewhat between the extremes of the input and output stages. Typically, this type of design has been accomplished by cut and try methods wherein the number of intermediate stages added for minimizing delay comprises a number less than five. Typically these efforts have also involved circuits wherein the capacitance of the output or off-chip driver stage was less than one hundred times that of the signal driver stage. Due to their empirical nature of the circuit design techniques described hereinbefore as utilized in the prior art are generally unsuitable for design of amplifiers having a large number of stages.

SUMMARY OF THE INVENTION

Accordingly, a need has been recognized for some means of designing multi-stage driver circuits wherein the number of intermediate driver circuits can be identified which will lead to the minimum propogration delay between a signal driver circuit and an off-chip or load driver circuit. Furthermore a need has been recognized for some means of determining the ideal capacitance of any given intermediate stage of the selected number.

In view of the foregoing, it is an object of the present invention to provide an integrated circuit structure wherein an intermediate driver circuit comprising multiple stages which are cascaded between a signal driver such as a logic circuit of an LSI chip and the high capacitive load driver, such as a load driver for long interconnection lines, is provided having a number of stages selected whereby the total delay in the signal source is minimized. The load driver is preferably located on the LSI chip. The foregoing circuit design is achieved in accordance with mathematical parameters described in detail hereinafter and is especially useful in connection with large scale integrated circuits wherein the capacitance of the load driver is at least one hundred times greater than the capacitance of the logic driver, and wherein the number of intermediate driver stages is five or greater.

BRIEF DESCRIPTION OF THE DRAWING

The drawing illustrates one preferred embodiment of the invention wherein an intermediate driver circuit comprising at least five stages is illustrated, with the stages being cascaded between an input logic circuit and an outside load driving circuit.

DETAILED DESCRIPTION OF THE INVENTION

Referring now to the drawing, one preferred embodiment of the invention is illustrated comprising a multi-stage driver circuit including at least five intermediate driver stages which are inserted between a logic signal driver stage and a load driver stage. As shown, the logic circuit driver stage includes a field effect transistor 10 having its gate connected to a signal input terminal 12. The logic circuit illustrated comprises a grounded source field effect transistor inverter having its drain connected as an input to the gate of the next succeeding stage comprised of transistor 20. In similar fashion, transistors 30 and 40 are provided, again cascaded in conventional fashion with grounded sources. Transistor 40 comprises the last stage of amplification necessary for providing load driving capability at terminal 42.

Field effect transistors 15 and 25 are associated with transistors 10 and 20 in a conventional fashion comprising load resistances connected between a drain voltage source terminal 32 and the drains of devices 10, 20 respectively. In similar fashion, field effect transistors 35, 45, connected in the same fashion an associated with transistors 30, 40 respectively.

In the configuration illustrated in the drawing, the number of intermediate stages is selected to provide the optimum total delay for the circuit illustrated and the capacitance of each stage of the circuit illustrated is determined according to mathematical parameters described in detail hereinafter.

Although the circuit illustrated is comprised of field effect transistors it should be apparent that the optimization theories explained hereinafter are equally applicable to bipolar device technology.

When a regular FET logic or memory circuit, for instance a grounded source FET inverter, drives a load driver circuit, the logic circuit channel width to channel length ratio $W_1/L_1$ of the logic driver is determined by the current requirement as well as the photolithographic tolerances, and that of the load driver $W_d/L_d$ is determined by the required current handling capability. One may assume that all channel lengths are equal ($L_d = L_1 = L$), and that the internal resistances, $R_{FET}$, of the load device and the logic devices are approximately equal to their respective load resistances as shown in Equations 1 and 2.

$$R_{FETd} \text{ (driver)} = \frac{L}{\gamma W_d (V_{gs} - V_{th})} \cong R_d \quad (1)$$

$$R_{FET1} \text{ (logic)} = \frac{L}{\gamma W_1 (V_{gs} - V_{th})} \cong R_1 \quad (2)$$

A second assumption leads to a desirable result that the output waveforms of these two FET devices will have approximately equal rise time and fall time by assuming that the devices are operated at non-current saturation or linear regions; where $\gamma = \mu n \, (\epsilon_{ox}/t_{ox})$ and $\epsilon_{ox}$, $t_{ox}$ denote respectively the dielectric constant and the thickness of the gate oxide and $\mu_n$, the mobility constant of electrons. The delay time of charging or discharging the driver gate electrode is approximately:

$$T_t \cong 3 R_1 C_d \quad (3)$$

where $C_d$ is the input capacitance of the driver. Although including some stray capacitance, $C_d$ is contributed largely from the driver gate capacitance especially for a self-aligned large FET driver.

$$C_d \cong C_o W_d L \quad (4)$$

where $C_o$ is the per unit area gate capacitance controlled by gate oxide thickness. Similarly the input capacitance of the logic device is:

$$C_1 \cong C_o W_1 L \quad (5)$$

From Equations 1 to 5, it follows that $$T_t = k \, (C_d/C_1) \quad (6)$$

where $k = 3L^2/\mu_n (V_{gs} - V_{th})$ is a proportional constant with the following assumed parameters:

$\mu_n \cong 500 \text{ cm}^2/\text{volt-sec}$
$L = 5 \times 10^{-4} \text{ cm}$
$V_{gs} - V_{th} = 4 \text{ volt}$
$K = 0.375 \text{ ns}$ When $W_d$ is very much larger than $W_1$, such as 1000 times, $T_t$ can be a substantial 375 ns. This delay time can be reduced by inserting an intermediate stage between the logic driver and the load driver.

Assuming again that $C_2 = C_o W_2 L$ and $R_2 = R_{FET2}$ in the non-current saturation region, the total delay of the circuit will be $$T_t \cong 3 R_1 C_2 + 3 R_2 C_d$$

$$\cong k \left( \frac{C_2}{C_1} + \frac{C_d}{C_2} \right) \quad (7)$$

By taking the partial derivative of $T_t$ with respect to $C_2$, the optimal delay happens at $$C_2 = \sqrt{C_d C_1} \quad (8)$$

and $$T_t \cong 2k \sqrt{C_d/C_1} \quad (9)$$

The foregoing analysis can be generalized to include multi-stage drivers of gradually increasing channel widths. Thus, if the first stage represents a logic device with a gate ratio of $W_1/L$ and the driver $W_D/L$ with an input capacitance $C_d$ remain the same as those in the previous derivation, the total driver configuration may have multiple intermediate stages. Similar to Equation (7), the total driver delay will be $$T_t \cong k \left( \frac{C_2}{C_1} + \frac{C_3}{C_2} + \frac{C_4}{C_3} + \ldots + \frac{C_d}{C_n} \right)$$

where $C_2$, $C_3$, etc., represent the input gate capacitance of devices $W_2/L$, $W_3/L$, etc.

Again by taking the partial derivative with respect to $T_t$, the optimal delay occurs at $$C_p = \sqrt{C_{p-1} C_{p+1}} \quad 2 \leq p \leq n \quad (11)$$

and $$T_t = nK \sqrt[n]{C_d/C_1} \quad (12)$$

In Equation (11), $C_d$ is designated as $C_{n+1}$. Assume that $C_d/C_1 = M$ and $C_1 =$ unit capacitance If the number of intermediate driver stages is $n$, an optimal number of such stages can be found in order to get a shortest total delay by setting $$\frac{\alpha T_t}{\alpha n} = \frac{\alpha}{\alpha n} \left( nM^{\frac{1}{n}} K \right) \stackrel{set}{=} 0 \quad (13)$$

or
$n = 1nM$

The optimal number of intermediate driver stages is therefore ($1nM$). Since $n$ has to be an integer while $1nM$ may not, $n$ should assume the integer value closest to $1nM$.

Accordingly, it is demonstrated by Equation 13 that the optimum number of stages for the minimum propogation delay between input and output of the driver circuit illustrated is selected to be $n = 1n \, M$ wherein $n$ should assume the integer value closest to $1nM$. It has been recognized that the total delay is not sensitive to lower values of $n$, but that the delay time reduction is very substantial by utilizing $n$ selected according to the foregoing parameter where $n$ is sufficiently larger as occurs where great disparity exists between the capacitance of the signal driver and the load device. Moreover, it is recognized that in instances where the capacitance of the load driver is 1,000 times or more greater than the capacitance of the logic circuit or signal driver then the parameters illustrated in Equation 13 can, if utilized, result in selection of a number of intermediate stages which will result in substantial reductions in delay time, where as cut and try methods are inadequate. This situation will occur where the number of intermediate stages is five or greater; and the situation where ten or more intermediate stages might be used clearly could only be optimized by using the parameters described herein.

Once the total number of intermediate stages has been determined, Equation 8 can be utilized to determine the capacitance of any or each given intermediate stage.

What is claimed is:

1. In an integrated circuit structure wherein the output of a signal driver circuit contained on a monolithic chip is connected via multiple intermediate driver stages to the input of a load driving circuit, with the output capacitance of the load driver circuit being at least one hundred times greater than the output capacitance of the signal driver;

a plurality of $n$ intermediate driver stages which will minimize the total signal propogation delay between the signal driver and the load driver, where $n$ is selected to be at least five and otherwise satisfies the equation $n = \ln M$ with $M =$ capacitance of load driver/capacitance of signal driver.

2. The circuit of claim 1 wherein the capacitance of each intermediate stage is selected to be equal to the square root of the product of the output capacitance of the preceeding driver stage and the output capacitance of the succeeding driver stage.

* * * * *